(12) United States Patent
Lee et al.

(10) Patent No.: US 7,541,628 B2
(45) Date of Patent: Jun. 2, 2009

(54) IMAGE SENSORS INCLUDING ACTIVE PIXEL SENSOR ARRAYS

(75) Inventors: Duck-hyung Lee, Yongin-si (KR); Kang-bok Lee, Suwon-si (KR); Seok-ha Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 35 days.

(21) Appl. No.: 11/481,733

(22) Filed: Jul. 7, 2006

(65) Prior Publication Data

US 2007/0007559 A1    Jan. 11, 2007

(30) Foreign Application Priority Data

Jul. 9, 2005    (KR) ................ 10-2005-0061968
Jul. 26, 2005   (KR) ................ 10-2005-0068103

(51) Int. Cl.
*H01L 31/062* (2006.01)
(52) U.S. Cl. ............... 257/239; 257/258; 257/291; 257/292; 257/E27.133
(58) Field of Classification Search ............... 257/239, 257/291, 292, E27.133; 438/48
See application file for complete search history.

(56) References Cited

U.S. PATENT DOCUMENTS

| | | | |
|---|---|---|---|
| 5,262,345 A * | 11/1993 | Nasser et al. ............ 438/203 |
| 6,301,051 B1 | 10/2001 | Sankur | |
| 6,352,869 B1 * | 3/2002 | Guidash ............ 438/16 |
| 6,545,304 B2 | 4/2003 | Okamoto | |
| 6,657,665 B1 * | 12/2003 | Guidash ............ 348/308 |
| 6,693,670 B1 * | 2/2004 | Stark ............ 348/308 |
| 6,734,906 B1 | 5/2004 | Hashimoto | |
| 6,873,338 B2 * | 3/2005 | Berstis ............ 345/596 |
| 6,977,684 B1 * | 12/2005 | Hashimoto et al. ...... 348/294 |
| 7,232,712 B2 * | 6/2007 | Han ............ 438/144 |
| 2003/0184665 A1 * | 10/2003 | Berstis ............ 348/294 |
| 2004/0096124 A1 * | 5/2004 | Nakamura ............ 382/308 |
| 2005/0012836 A1 | 1/2005 | Guidash | |
| 2005/0088556 A1 * | 4/2005 | Han ............ 348/308 |
| 2006/0145203 A1 * | 7/2006 | Toros et al. ............ 257/291 |

* cited by examiner

*Primary Examiner*—Evan Pert
*Assistant Examiner*—Selim Ahmed
(74) *Attorney, Agent, or Firm*—Volentine & Whitt, P.L.L.C.

(57) ABSTRACT

In one aspect, an image sensor is provided which includes an array of unit active pixels. Each of the unit active pixels comprises a first active area including a plurality of photo-electric conversion regions, and a second active area separated from the first active area. The first active areas are arranged in rows and columns so as to define row and column extending spacings there between, and the second active areas are located at respective intersections of the row and column extending spacings defined between the first active areas.

21 Claims, 8 Drawing Sheets

IMAGE SENSORS INCLUDING ACTIVE PIXEL SENSOR ARRAYS

BACKGROUND OF THE INVENTION

1. Field of the Invention

The present invention generally relates to image sensors. More particularly, the present invention relates to active pixel sensors in which the read-out circuitry thereof is shared by two or more sensor elements.

A claim of priority is made to Korean patent application nos. 2005-61968 and 2005-68103, filed Jul. 9, 2005, and Jul. 26, 2005, respectively, the contents of which are incorporated by reference herein in their entireties.

2. Description of the Related Art

Certain types of image sensors utilize photo detectors to capture incident light and convert the light to an electric charge capable of image processing. Examples include Complimentary Metal Oxide Semiconductor (CMOS) image sensors (CIS). CIS devices are generally characterized by analog sensing circuits coupled to CMOS control circuits. The analog sensing circuits include an array of photo detectors having access devices (e.g., transistors) for connection to word lines and bit lines. The CMOS control circuits may include a timing generator and a variety of image processing circuits, such as row decoders, column decoders, column amplifiers, output amplifiers, and so on. Generally speaking, the configuration of the CIS device is analogous to that of a CMOS memory device.

Figure 1:
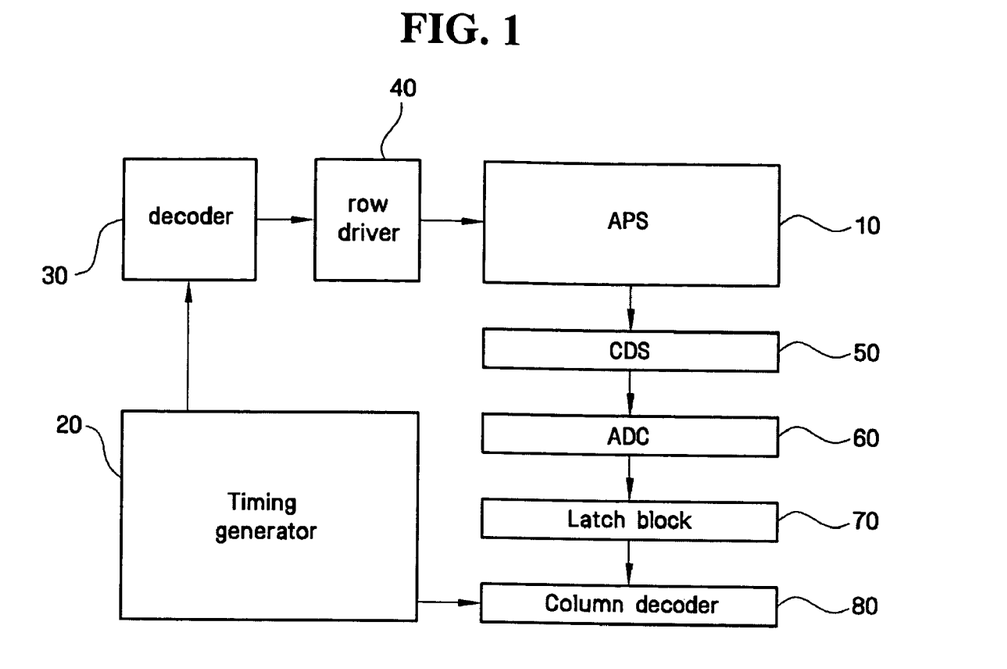
FIG. 1 is a block diagram of a CMOS image sensor (CIS) device.

FIG. 1 is a block diagram of an example of a CMOS image sensor (CIS). The CMOS image sensor of FIG. 1 generally includes an active pixel sensor (APS) array 10, a timing generator 20, a row decoder 30, a row driver 40, a correlated double sampling and digital converting (CDS) circuit 50, an analog to digital converter (ADC) 60, a latch circuit 70, and a column decoder 80.

Those of ordinary skill are well-acquainted with the operation of the CIS represented in FIG. 1, and a detailed description thereof is therefore omitted here. Generally, however, the timing generator 20 controls the operational timing of the row decoder 30 and column decoder 80. The row driver 40 is responsive to the row decoder 30 to selectively activate rows of the active pixel array 10. The CDS 50 and ADC 60 are responsive to the column decoder 80 and latch circuit 70 to sample and output column voltages of the active pixel array 10. In this example, image data is output from the latch circuit 70.

The APS array 10 contains a plurality of active unit pixels arranged in rows and columns. Each active unit pixel includes a photoelectric conversion device and readout circuitry for transferring charges of the photoelectric conversion device to an output line.

Figure 2:
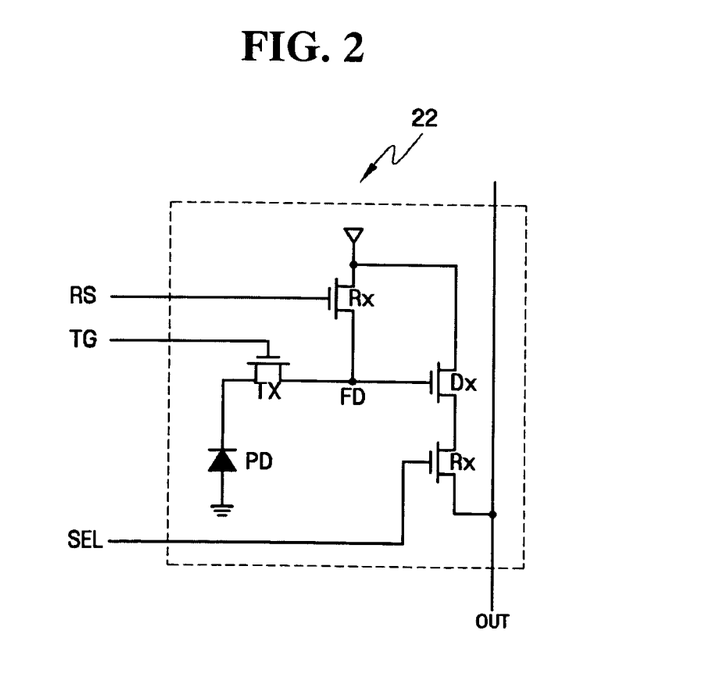
FIG. 2 is an equivalent circuit diagram of an active pixel in an active pixel array of the CIS device of FIG. 1.

Reference is now made to FIG. 2 which is an equivalent circuit diagram of an example of an active pixel 22 of the APS array 10 shown in FIG.

A photoelectric conversion element PD (e.g., a photo-diode, a photo-gate type image element, etc.) of the active pixel 22 captures incident light and converts the captured light into an electric charge. The electric charge is selectively transferred from the photoelectric conversion element PD to a floating diffusion region FD via a transfer transistor TX. The transfer transistor TX is controlled by a transfer gate TG signal. The floating diffusion region FD is connected to the gate of a drive transistor Dx which functions as a source follower (amplifier) for buffering an output voltage. The output voltage is selectively transferred as an output voltage OUT by a select transistor Sx. The select transistor Sx is controlled by a row select signal SEL applied to the gate of the select transistor Sx. Finally, a reset transistor Rx is controlled by a reset signal RS to selectively reset charges accumulated in the floating diffusion region FD to a reference voltage level.

It is noted that one or more of the transistors shown in FIG. 2 may be optionally omitted. For example, the floating diffusion region FD may be electrically connected to the photoelectric conversion element PD, in which case the transfer transistor TX may be omitted. As another example, the drive transistor Dx may be electrically connected to the output line OUT, in which case the selection transistor Sx may be omitted.

In an effort to increase pixel density, it is known to configure CIS devices such that the unit active pixels thereof each contain multiple photoelectric conversion elements PD which share common readout circuitry. However, conventional shared pixel CIS configurations and layouts suffer drawbacks in that the photoelectric conversion elements PD are defined by relatively small light photoelectric conversion areas. In addition, the photoelectric conversion areas are separated from one another at unequal pitches in row and/or column directions. Thus, the conversion efficiency and/or image quality of these CIS devices adversely impacted.

SUMMARY OF THE INVENTION

According to one aspect of the present invention, an image sensor is provided which includes an array of unit active pixels. Each of the unit active pixels comprises a first active area including a plurality of photoelectric conversion regions, and a second active area separated from the first active area. The first active areas are arranged in rows and columns so as to define row and column extending spacings there between, and the second active areas are located at respective intersections of the row and column extending spacings defined between the first active areas.

According to another aspect of the present invention, an image sensor is provided which includes an active pixel array including an array of unit active pixels. Each of the unit active pixels includes a first active area and an elongate second active area in a substrate. The first active area includes a plurality of photoelectric conversion regions aligned in a first direction, and the elongate second active area is separated from the first active area and extending lengthwise in the first direction.

According to still another aspect of the present invention, an image sensor is provided which includes an active pixel array including a plurality of unit active pixels formed on a substrate. The plurality of unit active pixels comprises adjacent first and second unit active pixels. Each of the first and second unit active pixels comprises a first active area including two photoelectric conversion regions, and an elongate second active area which is separated from the first active area. The photoelectric conversion regions of the first and second unit active pixels are aligned in a first direction, and the second active area of the first unit active pixel extends lengthwise in the first direction and is located adjacent a boundary between the first and second unit active pixels.

According to yet another aspect of the present invention, an image sensor is provided which includes an active pixel array in which readout circuitry is shared by at least two photoelectric conversion regions for each unit active pixel of the active pixel array, and in which a pitch between adjacent photoelectric conversion regions is substantially the same in column and row directions of the active pixel array.

According to another aspect of the present invention, a system is provided which includes a processor, a memory and an image sensor connected to a data bus. The image sensor includes an active pixel array in which readout circuitry is shared by at least two photoelectric conversion regions for each unit active pixel of the active pixel array, and in which a pitch between adjacent photoelectric conversion regions is substantially the same in column and row directions of the active pixel array.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

The present invention will now be described by way of several preferred but non-limiting embodiments.

Figure 3:
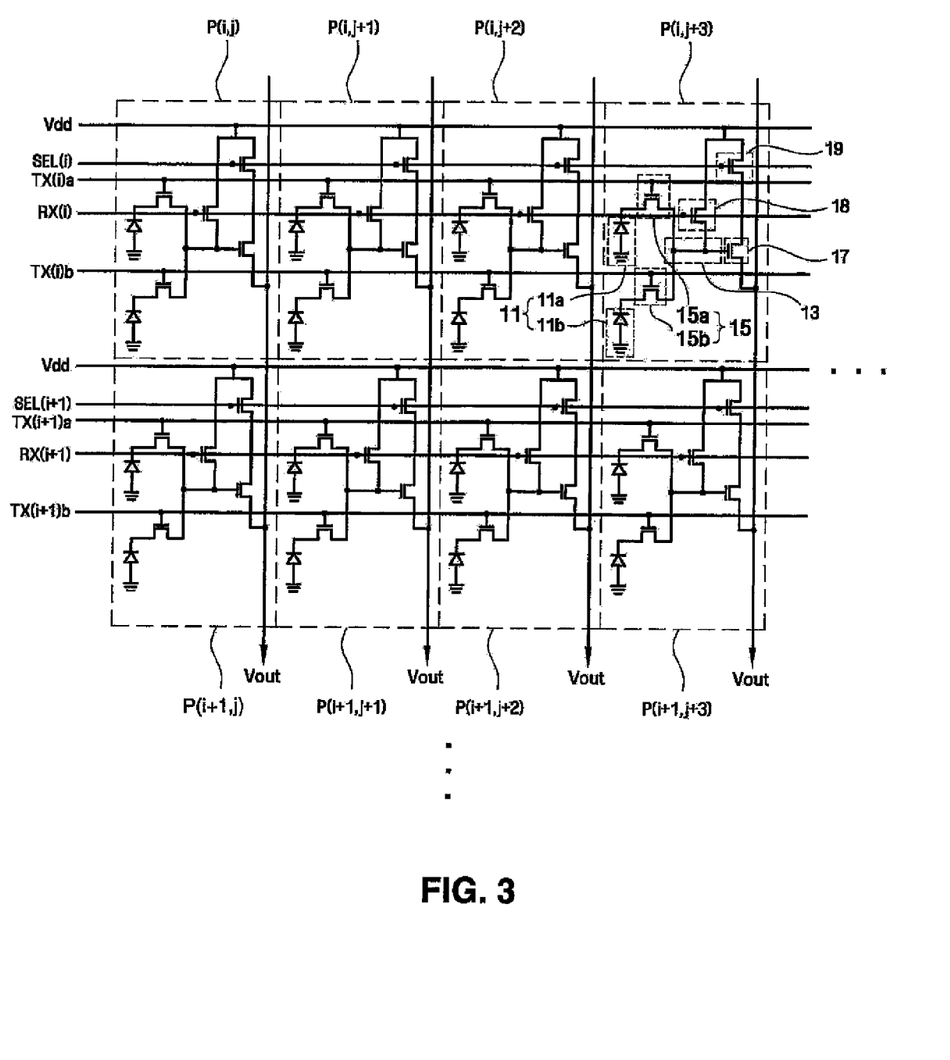
FIG. 3 is a circuit diagram of an active pixel sensor (APS) array according to an embodiment of the present invention.

FIG. 3 is a circuit diagram illustrating a shared two-pixel active pixel array (APS) according to a non-limiting embodiment of the present invention. Herein, the phrase "shared two-pixel APS" means that pairs of photoelectric conversion elements of the APS share the same read-out circuitry. Each pair of photoelectric conversion elements and their associated read-out circuitry are referred to herein as a "unit active pixel".

Referring to FIG. 3, the shared two-pixel APS includes a plurality of unit active pixels P arranged in rows (i, i+1, . . . ) and columns (j, j+1, j+2, j+3, . . . ). Each of the unit active pixels P is similarly configured, and accordingly, only the unit active pixel P(i, j+3) is described below.

The unit active pixel P(i, j+3) includes a pair 11 of photoelectric conversion elements 11a and 11b, a pair 15 of transfer transistors 15a and 15b, and a common floating diffusion region 13. As shown in FIG. 3, the transfer transistor 15a and the photoelectric conversion element 11a are connected in series between the floating diffusion region 13 and a reference potential (e.g., ground). Likewise, the transfer transistor 15b and the photoelectric conversion element 11b are connected in series between the floating diffusion region 13 and the reference potential (e.g., ground). The transfer transistor 15a is gated to and controlled by a transfer gate line TX(i) a connected to each of the unit active pixels P of the row (i), and the transfer gate 15b is gated to and controlled by a transfer gate line TX(i)b also connected to each of the unit active pixels P of the row (i).

The floating diffusion region 13 is connected to the gate of a drive transistor 17, and the drive transistor 17 and a select transistor 19 are connected in series between a reference voltage (e.g., Vdd) and an output line Vout. The select transistor 19 is gated to and controlled by a select line SEL(i) connected to each of the unit active pixels P of the row (i). A reset transistor 18 is connected between the reference voltage (e.g. Vdd) and the floating diffusion region 13, and is gated to and controlled by a reset line RX(i) connected to each of the unit active pixels P of the row (i).

In operation, the photoelectric conversion elements 11a and 11b of the unit active pixel P(i, j+3) capture incident light and convert the captured light into an electric charge. The photoelectric conversion elements 11a and 11b may optionally be implemented by photo-diodes or photo-gate type image elements, although other types of photoelectric conversion devices may be utilized. Under control of the transfer gate lines TX(i)a and TX(i)b, the electric charges are selectively transferred from the photoelectric conversion elements 11a and 11b to the floating diffusion region 13 via the transfer transistors 15a and 15b, respectively. The drive transistor 17 connected to the floating diffusion region 13 functions as a source follower (amplifier) for buffering an output voltage. The select transistor 19 is responsive to the select line SEL(i) to selectively transfer the output voltage to the output line Vout. Finally, the reset transistor 18 is controlled by a reset line RX(i) to selectively reset (or bias) charges accumulated in the floating diffusion region 13 to the reference voltage level (e.g., Vdd).

Figure 4:
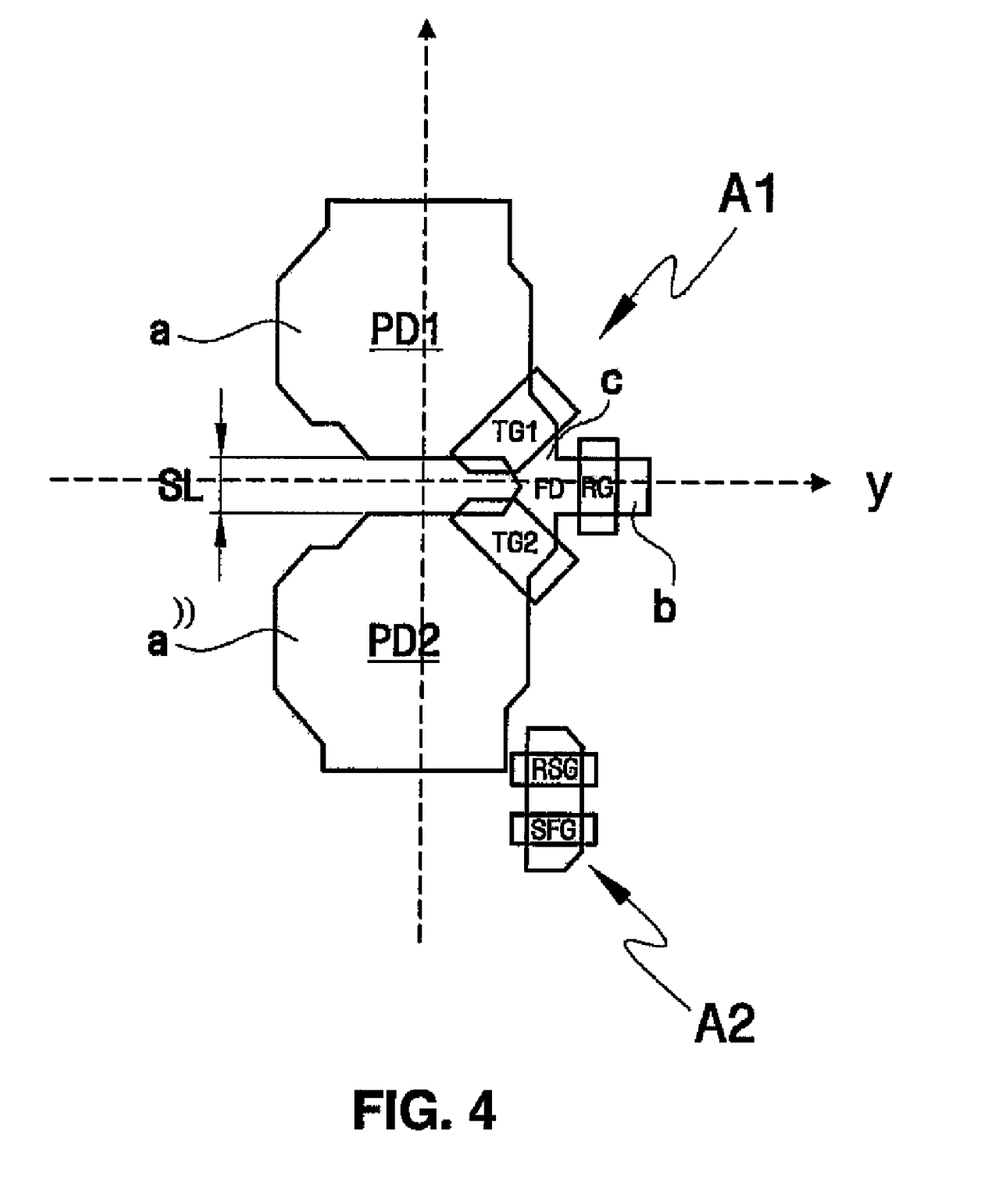
FIGS. 4, 5 and 6 illustrate the pixel layout of an APS array according to an embodiment of the present invention.

FIG. 4 is a top view illustrating the layout of active areas and transistor gates of a unit active pixel according to an embodiment of the present invention.

Referring to FIG. 4, each unit active pixel includes two (2) active area patterns A1 and A2 located at the surface of a semiconductor substrate. The non-active area of the substrate may, for example, be insulating regions such as shallow trench isolation (STI) regions or local oxidation of silicon (LOCOS) regions. Alternately, the non-active areas of the substrate may, for example, be junction isolation regions such highly counter-doped impurity regions.

The first active area pattern A1 contains two photoelectric conversion element regions PD1 and PD2, a floating diffusion region FD, transfer gates TG1 and TG2, and a reset gate RG. The photoelectric conversion regions PD1 and PD2 correspond to the photo conversion elements 11a and 11b of FIG. 3, the floating diffusion region FD corresponds to the floating diffusion region 13 of FIG. 3, the transfer gates TG1 and TG2 correspond to gates of the transfer transistors 15a and 15B of FIG. 3, and the reset gate RG corresponds to the gate of the reset transistor 18 of FIG. 3. The second active area pattern A2 contains a row select gate RSG and a source follower gate SFG. The row select gate RSG corresponds to the gate of the select transistor 19 of FIG. 3, and the source follower gate SFG corresponds to the gate of the drive transistor 17 of FIG. 3.

Still referring to FIG. 4, the first active area pattern A1 includes two vertically aligned active area portions a' and a" which respectively contain the photoelectric conversion elements PD1 and PD2. For explanation purposes, the vertical direction is defined by the dashed line "x" of FIG. 4, and is coincident with the column direction of the APS array shown in FIG. 3. Each of the active area portions a' and a" have multi-faceted polygonal outer peripheries. These outer peripheries are intended to approximate a circular shape in order to conform as closely as possible to the configuration of micro-lenses (not shown) positioned over the photoelectric conversion regions PD1 and PD2. Also, in the example of this embodiment, the active area portions a' and a" are separated by a local spacing SL and define substantially mirror images of one another about a horizontal axis centered there between. The horizontal axis is illustrated by the dashed line "y" in FIG. 4 and is parallel to the row direction of FIG. 3.

The active area portions a' and a" are connected at opposing corners by an active area portion c of the first active area pattern A1. As shown, the active area portion c contains at least a portion of the floating diffusion region FD. A transfer gate channel region is defined within the active area portions a' and/or c below the first transfer gate TG1, and another transfer gate channel region is defined within the active area portions a" and/or c below the second transfer gate TG2.

The remaining corners of the active area portions a' and a" (i.e., the corners not connected to the active area portion c) include notched or indented peripheral portions to allow for close proximity placement of portions of adjacent unit active pixels. This aspect of the embodiment will be explained in more detail later with reference to FIG. 5.

Still referring to FIG. 4, the first active area pattern A1 also includes an active area portion b which extends outwardly in the horizontal direction from the active area portion c. A reset gate channel region is defined within the active areas portions c and/or b below the reset gate RG. Although not shown, the active area portion b is connected to a reference potential (e.g., Vdd).

As shown in FIG. 4, the second active area pattern A2 is elongate in the vertical direction and spaced from the first active area pattern A2 adjacent the lower corner thereof. Also, in the diagram, the left-side of the second active area pattern A2 is substantially aligned vertically with the rights sides of the active area portions a' and a".

It is noted that the floating diffusion region FD is an example of a readout storage node region which is utilized to readout the charges accumulated by the photoelectric conversion element regions PD1 and PD2. However, the invention is not limited to the use of floating diffusion regions, and other types of readout storage node regions may instead be implemented. Further, the embodiment of FIG. 3 is intended to realize the circuit configuration of FIG. 2. However, the invention is not limited in this respect, and other circuit configurations may instead be implemented.

Figure 5:
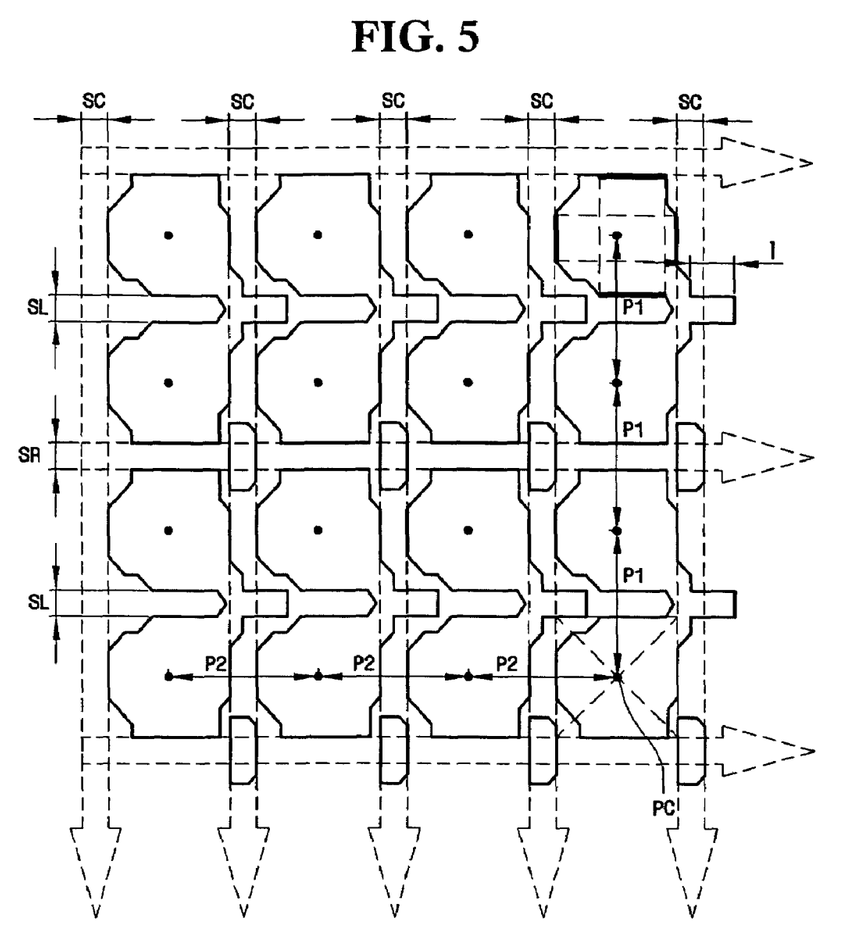

FIG. 5 illustrates an array of the active area patterns shown in FIG. 4.

Referring to both of FIGS. 4 and 5, the active area patterns A1 and A2 are vertically aligned in columns and horizontally aligned in rows. The distance between adjacent active area patterns A1 within the same row is defined herein as a column spacing SC. The distance between adjacent active area patterns A1 within the same column is defined herein as a row spacing SR. Also, as previously mentioned, the distance between active area portions a' and a" is defined herein as a local spacing SL.

The second active area patterns A2 are located at the intersections of the column spacings SC and the row spacings SR. Further, the second active area patterns A2 extend lengthwise in a direction of the column spacings SC. As mentioned above, and as shown in FIG. 5, the corners of the active area patterns A1 are notched or indented to allow sufficient space for placement of the active area patterns A2. Preferably, the widths of the column spacings SC, row spacings SR and local spacings SL are all the same. Also, the width of each second active pattern area A2 is the same as and coincident with the width of each column spacing SC.

Within each row, the active area portion b of each active area pattern A1 extends beyond the column spacing SC and between the active area portions a' and a" of an adjacent active area pattern A1. Again, the corners of the active area patterns A1 are notched or indented to allow sufficient space for placement of the active area portion b of an adjacent active area patterns A1. The configuration of the example illustrated in FIGS. 4 and 5 offers a number of advantages. For example, the column pitch P1 and row pitch P2 between centers PC of the photoelectric conversion regions PD can be easily equalized by appropriate design of the column spacing SC, row spacing SR and local spacing SL. Further, pixel density is enhanced (i.e., the pitch is reduced) by extending the portion b of each active area pattern A1 between the portions a' and a" of an adjacent active area pattern A1 in the same row. Also, pixel density is further enhanced by positioning the active area patterns A2 lengthwise in the column spacings SC.

The invention is not limited to the specific example of FIGS. 4 and 5. As one example only, the reset gate RG can be placed in the second active area pattern A2 rather than the first active area pattern A1. Also, the outer peripheries of the active area patterns A1 and A2 need not be the same as those illustrated in the examples of FIGS. 4 and 5. As one skilled in the art will appreciate, other variations are possible without departing from the spirit and scope of the invention.

Figure 6:
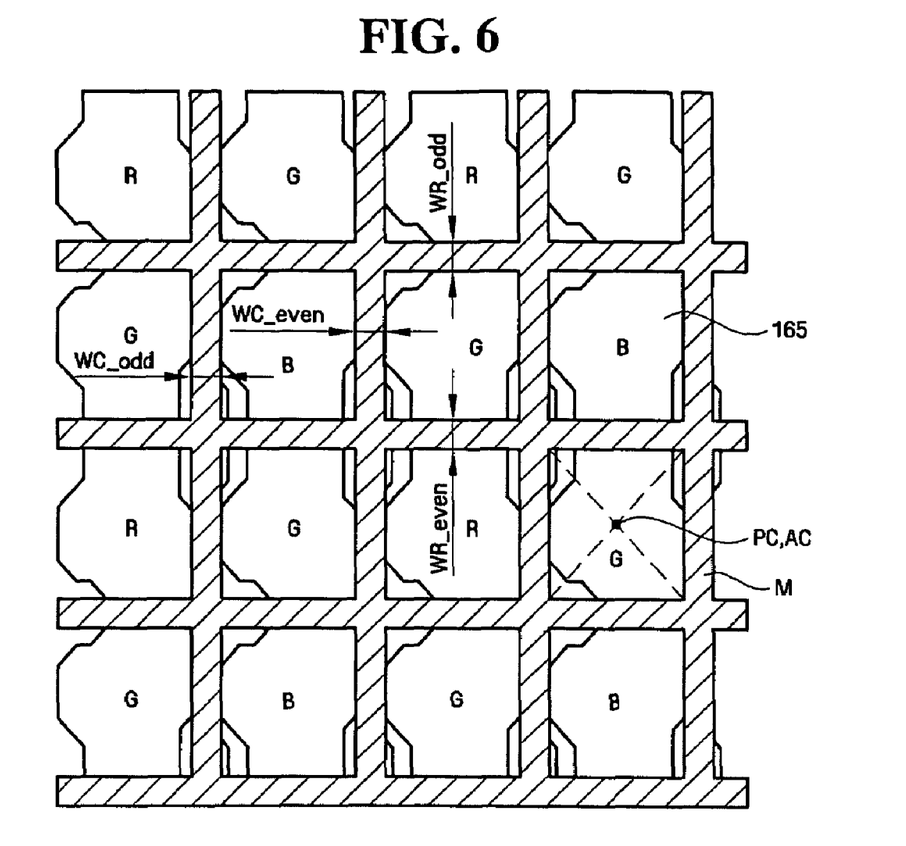

Attention is now directed to FIG. 6 which illustrates a blocking pattern M positioned over the array of FIG. 5. Referring collectively to FIGS. 4 through 6, the blocking pattern M defines a plurality of optical apertures 165 aligned over the portions a' and a" of the active area patterns A1. The blocking pattern M may be formed of, for example, an aluminum or copper layer, and functions to block light from being incident on the floating diffusion regions FD and the read-out circuitry (TG1, TG2, RG, RSG and SFG).

In a preferred example of the present embodiment, the column spacing SC, the row spacing SR and the local spacing SL are all equal. In this case, the horizontal widths WR_odd and WR_even and the vertical widths WC_odd and WC_even the blocking layer M are substantially the same. In FIG. 6, the characters R, G and B denote red, green and blue color filter regions, respectively. As one skilled in the art will appreciate, in the example of FIG. 6, the X, G and B color filters are arranged in a so-called Bayer pattern.

Figure 7:
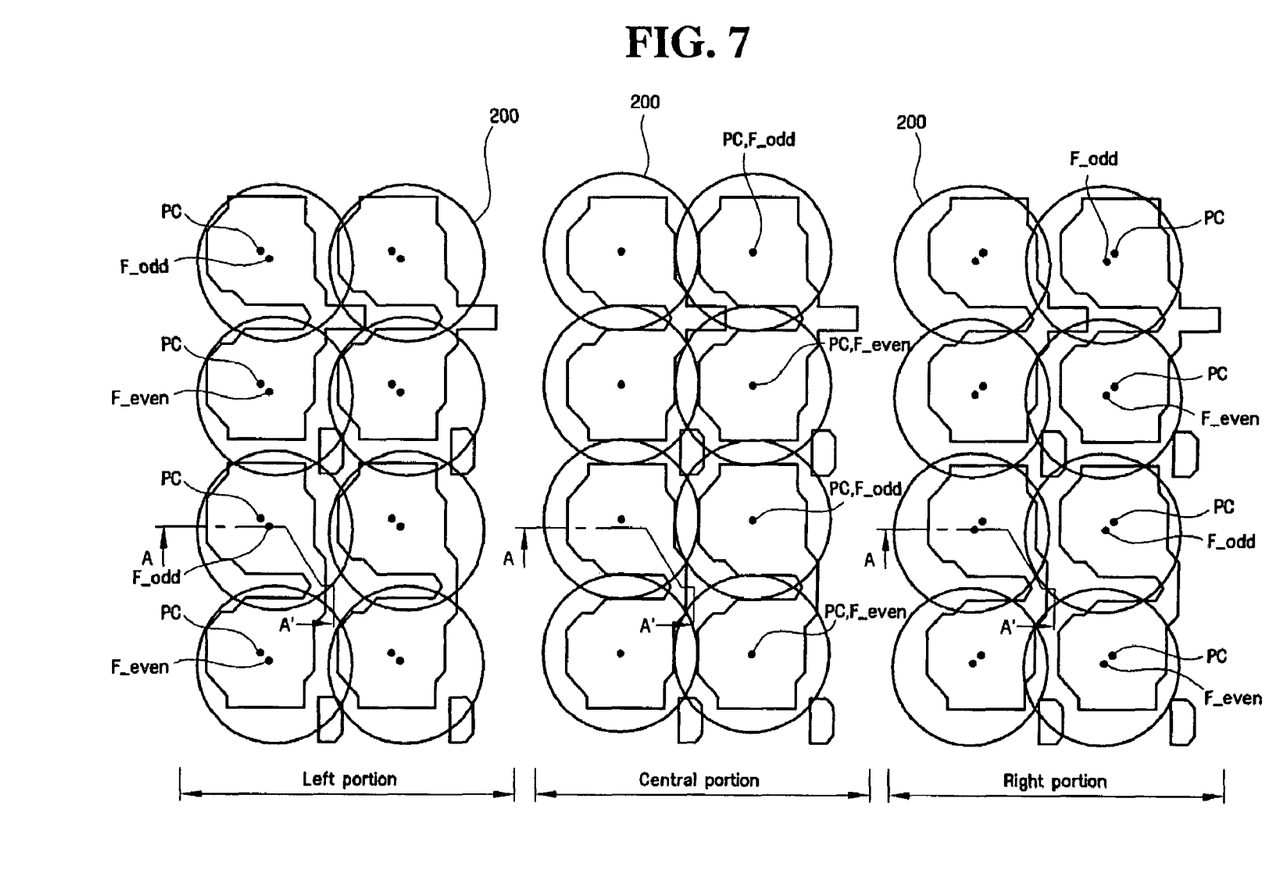
FIG. 7 illustrates the layout of micro-lenses in an APS array according to an embodiment of the present invention.

FIG. 7 illustrates an example of micro-lens placement in an APS array of an embodiment of the present invention. As shown in this figure, a plurality of micro-lenses 200 are respectively positioned over the photoelectric conversion regions of APS array such as that described above in connection with FIGS. 4-6. The micro-lenses 200 function to focus and filter incident light onto the underlying photoelectric conversion regions.

In FIG. 7, reference character F denotes the focal point of each lens 200, and reference character PC denotes the center of gravity of each underlying photoelectric conversion region. As illustrated in the drawing, the focal points F and centers PC may be intentionally offset in selected areas of the APS array in order to compensate for different angles in which light is incident across the surface of the APS array. For example, as shown in FIG. 7, the focal points F and centers PC may offset at left and right portions of the APS array, whereas the focal points F and center PC may be aligned at central portions of the APS array.

Figure 8:
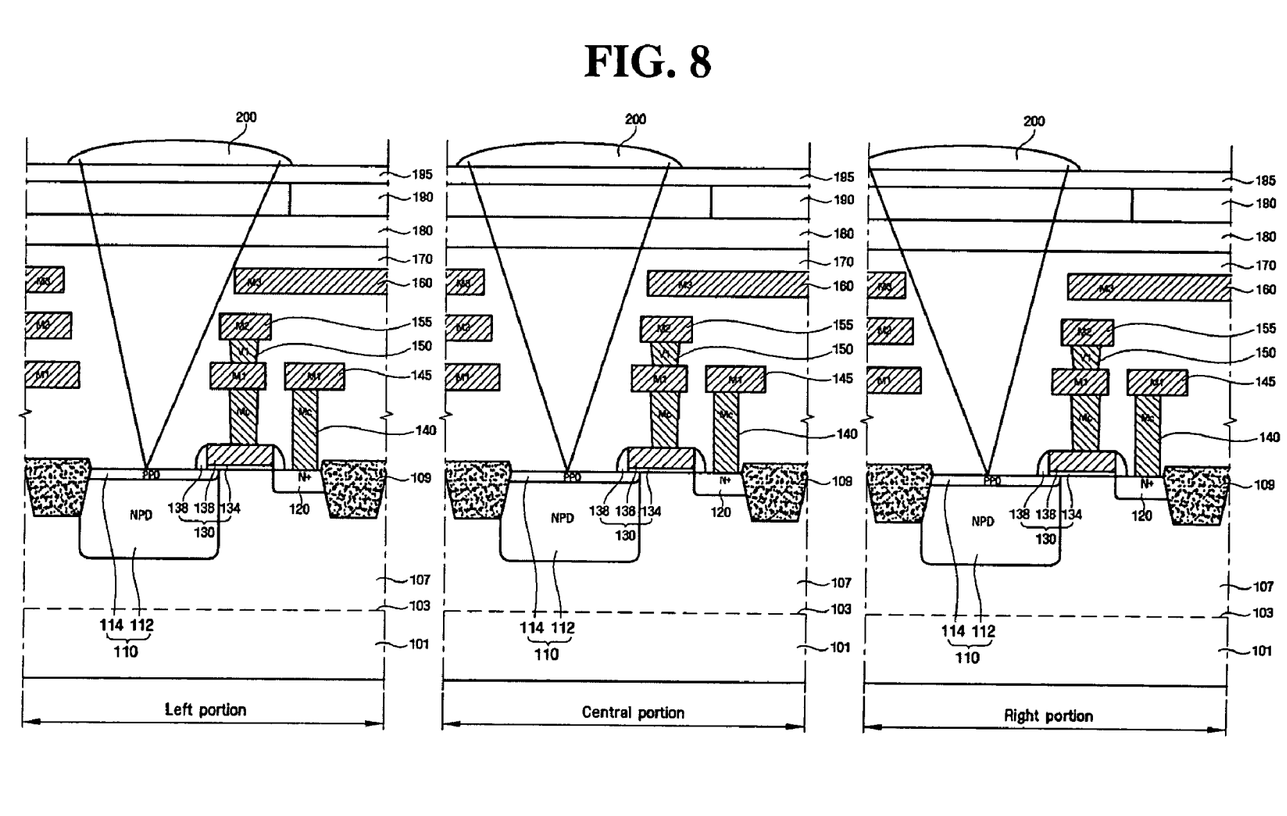
FIG. 8 is a cross-sectional view of active pixels according to an embodiment of the present invention.

FIG. 8 is an example showing a schematic cross-sectional view taken along line A-A' of FIG. 7.

Referring to FIG. 8, photoelectric conversion elements 110 containing a pinning layer 114 and a photodiode region 112 are formed in a n-type doped semiconductor substrate 101 having a p-type epitaxial layer 107. In this example, a gathering layer 103 (which functions to decrease dark current and reduce white defects) is also formed by implantation of IV family atoms such as carbon, germanium or a combination of thereof.

An isolation region 109 is formed in the surface of the substrate so as to define the active area patterns (e.g., A1, A2 in FIG. 4). A gate dielectric layer 134 is then formed at a thickness of about 5 to 100 Å on the substrate 101. The gate dielectric layer 134 may, for example, be formed of $SiO_2$, SiON, SiN, $Al_2O_3$, $Si_3N_4$, $Ge_xO_yN_z$, $Ge_xSi_yO_z$, $HfO_2$, $ZrO_2$, $Al_2O_3$, $Ta_2O_5$, or a combination of two or more thereof.

Gate electrodes 136 and gate spacers 138 are then formed so as to define the transfer transistor, the drive (source follower) transistor (not shown), the reset transistor (not shown) and the row select transistor (not shown). The gate electrodes 136 may, for example, be formed of polysilicon, W, Pt, Al, TiN, Co, Ni, Ti, Hf, Pt or a combination of two or more thereof, and the gate spacers 138 may, for example, be formed of $SiO_2$, SiN or a combination thereof. A floating diffusion region 120 doped with n-type impurities, and a pinning layer 114 doped with p-type impurities are also formed as shown in FIG. 8.

Reference number 170 of FIG. 8 denotes one or more interlayer dielectric (ILD) layers formed over the substrate 101, and reference numbers 145 and 155 denote conductive lines formed within the ILD layer 170. Conductive plugs 140 are formed to connect the floating diffusion regions 120 and the conductive lines 145, and conductive plugs 150 are formed to electrically connect the transfer gate 130 to the second conductive lines 155. The conductive plugs 140 and 150, and the conductive lines 145 and 155 may, for example, be formed polysilicon and/or metals such as aluminum or copper.

Also formed in the ILD 170 is a blocking layer 160 made, for example, of aluminum, copper or other metallic material. The blocking layer 160 corresponds to the blocking layer M illustrated in FIG. 6. A first planarized layer 180, a color filter pattern 190, and a second planarized layer 195 are successively formed over the ILD 170, and micro-lenses 200 are then formed over the second planarized layer 195. As explained previously in connection with FIG. 7, the focal points of the micro-lenses 200 may be intentionally offset to compensate for different angles in which light is incident across the surface of the APS array.

Figure 9:
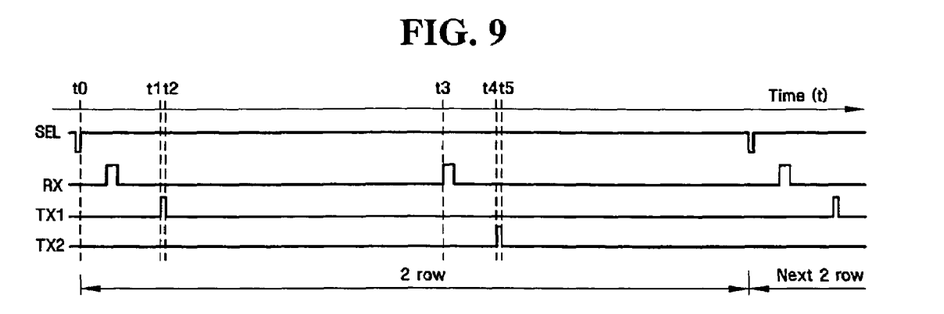
FIG. 9 is a timing diagram for explaining an operation of an APS array according to an embodiment of the present invention.

FIG. 9 is a timing diagram for explaining an operational example of a shared two-pixel APS array according to an embodiment of the present invention.

Referring to FIGS. 2 and 9 collectively, the photoelectric conversion elements 11 in each row of the APS array simultaneously accumulate charges depending on light incident thereto. The explanation that follows is with respect to the pixel P(i, j=3) of FIG. 2.

At time t0, the select line SEL(i) is driven HIGH to thereby activate (open) the select transistor 19. Subsequently, a clock pulse is applied to the reset line RX(i), and the reset transistor 18 is responsive thereto to reset the floating diffusion region 13 to the supply voltage (e.g., Vdd).

During time t1 to t2, a signal pulse is applied to the first transfer line TX(i)a, and as a result the first transfer transistor 15a is activated to transfer electrons in the photoelectric conversion element 11a to the floating diffusion region 13. The charges in the floating diffusion region 13 are applied to the gate of the drive transistor 17, thus resulting in a corresponding output voltage on the output line Vout. The output line Vout is connected to the correlated double sampler CDS 50 (FIG. 1) which holds the voltage level of the output Vout and compares the same with a reference voltage level of the output Vout.

Then, at time t3, a clock pulse is again applied to the reset line RX(i), and again the reset transistor 18 is responsive thereto to reset the floating diffusion region 13 to the supply voltage (e.g., Vdd).

During time t4 to t5, a signal pulse is applied to the second transfer line TX(i)b, and as a result the second transfer transistor 15b is activated to transfer electrons in the photoelectric conversion element 11b to the floating diffusion region 13. The charges in the floating diffusion region 13 are again applied to the gate of the drive transistors, thus resulting in a corresponding output voltage on the output line Vout.

The process described above is then repeated for each of the remaining rows of the APS array.

Figure 10:
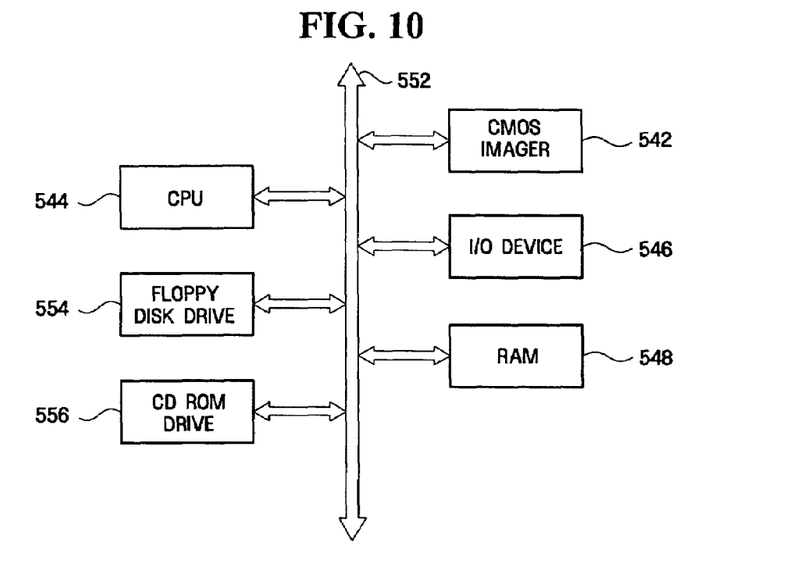
FIG. 10 is a block diagram of a processor based system employing an image sensor containing an APS array according to embodiments of the present invention.

FIG. 10 illustrates an exemplary processor-based system having a CMOS imager device 542, where the CMOS imager device 542 includes an image sensor according to the above-described embodiments of the present invention. The processor-based system is exemplary of a system receiving the output of a CMOS imager device. Without being limiting, such a system could include a computer system, camera system, scanner, machine vision system, vehicle navigation system, video phone, surveillance system, auto focus system, star tracker system, motion detection system, image stabilization system, mobile phone, all of which can utilize embodiments of the present invention.

Referring to FIG. 10, the processor based system of this example generally includes a central processing unit (CPU) 544, for example, a microprocessor that communicates with an input/output (I/O) device 546 over a bus 552. The CMOS imager device 542 produces an output image from signals supplied from an active pixel array of an image sensor, and also communicates with the system over bus 552 or other communication link. The system may also include random access memory (RAM) 548, and, in the case of a computer system may include peripheral devices such as a floppy disc drive 554, a CD-ROM drive 556 and/or a display (not shown) which also communicate with the CPU 544 over the bus 552. Other peripheral devices may be included such as a flash-memory card slot and the like. It may also be desirable to integrate the processor 544, CMOS imager device 542 and memory 548 on a single integrated circuit (IC) chip.

Although the present invention has been described above in connection with the preferred embodiments thereof, the present invention is not so limited. Rather, various changes to and modifications of the preferred embodiments will become readily apparent to those of ordinary skill in the art. Accordingly, the present invention is not limited to the preferred embodiments described above. Rather, the true spirit and scope of the invention is defined by the accompanying claims.

What is claimed is:

1. An image sensor comprising an array of unit active pixels, each of the unit active pixels comprising a first active area including a plurality of photoelectric conversion regions, and a second active area separated from the first active area by at least one non-active area, wherein the first active areas of the unit active pixels are arranged in rows and columns so as to define row and column spacings extending between adjacent first active areas, and wherein the second active areas of the unit active pixels are located at respective intersections of the row and column spacings defined between the first active areas.

2. The image sensor of claim 1, wherein each first active area comprises a first photoelectric conversion region, a second photoelectric conversion region, and a readout storage node region connected to the first and second photoelectric conversion regions.

3. The image sensor of claim 2, wherein the readout storage node region is a floating diffusion region.

4. The image sensor of claim 3, wherein each first active area further comprises a first transfer gate located between the first photoelectric conversion region and the floating diffusion region, and a second transfer gate located between the second photoelectric conversion region and the floating diffusion region.

5. The image sensor of claim 4, wherein each first active area further includes a reset gate.

6. The image sensor of claim 4, wherein each second active area includes a source follower gate and a select gate.

7. The image sensor of claim 2, wherein the first and second photoelectric conversion regions are arranged to define a local spacing between the first and second photoelectric conversion regions, a width of the local spacing being substantially the same as respective widths of the row and column spacings defined between the first active areas.

8. The image sensor of claim 1, wherein a width of each of the second active areas of the unit active pixels is substantially the same as a width of each of the column spacings defined between the first active areas.

9. The image sensor of claim 1, wherein a pitch between adjacent photoelectric conversion regions of the array of unit active pixels is substantially the same in both row and column directions of the array of unit active pixels.

10. The image sensor of claim 1, wherein the at least one non-active area separating the first and second active areas of each unit active pixel comprises an insulating region.

11. The image sensor of claim 1, wherein the at least one non-active area separating the first and second active areas of each unit active pixel comprises a counter-doped impurity region.

12. The image sensor of claim 2, wherein an outer periphery of each of the plurality of photoelectric conversion regions is defined by a polygon, wherein the readout storage node region is located between opposing corner regions of the first and second photoelectric conversion regions of each first active area.

13. The image sensor of claim 12, wherein the first active area further includes an elongated extension region extending lengthwise from the readout storage node region in a second direction which is perpendicular to a first direction, in which the first and second photoelectric conversion regions are aligned.

14. The image sensor of claim 13, wherein the elongated extension region of each first active area extends between adjacent first and second photoelectric conversion regions of an adjacent first active area of an adjacent unit active pixel.

15. An image sensor comprising an active pixel array including adjacent first and second unit active pixels, each of the first and second unit active pixels comprising a first active area including two photoelectric conversion regions aligned in a first direction, and an elongated second active area which is separated from the first active area and extends lengthwise in the first direction,
    wherein the two aligned photoelectric conversion regions of the first unit active pixel are aligned in the first direction with the two aligned photoelectric conversion regions of the second unit active pixel; and
    wherein the second active area of the first unit active pixel is located adjacent a boundary between the first and second unit active pixels.

16. The image sensor of claim 15, wherein each first active area further includes a readout storage node region located between the two aligned photoelectric conversion regions.

17. The image sensor of claim 16, wherein each first active area further includes a first transfer gate located between one of the two aligned photoelectric conversion regions and the readout storage node region, and a second transfer gate located between the other one of the two aligned photoelectric conversion regions and the readout storage node region.

18. The image sensor of claim 17, wherein each first active area further includes a reset gate.

19. The image sensor of claim 17, wherein each second active area includes a source follower gate and a select gate.

20. An image sensor, comprising:
    an active pixel array including a plurality of unit active pixels each unit active pixel comprising at least two photoelectric conversion regions in a first active area of the unit active pixel and readout circuitry in a second active area of the unit active pixel the readout circuitry being shared by the at least two photoelectric conversion regions the first active area and the second active area being separated by at least one non-active area in each unit active pixel,
    wherein a first pitch between adjacent photoelectric conversion regions in the first active area of each unit active pixel is substantially the same as a second pitch between adjacent photoelectric conversion regions of adjacent unit active pixels in column and row directions of the active pixel array, and
    wherein the first active areas of the unit active pixels are arranged in rows and columns so as to define row and column spacings extending there between, and wherein the second active areas of the array of unit active pixels are located at respective intersections of the row and column spacings defined between the first active areas.

21. A system, comprising:
    a processor, a memory and an image sensor connected to a data bus, said image sensor comprising an active pixel array including a plurality of unit active pixels, each unit active pixel comprising at least two photoelectric conversion regions in a first active area of the unit active pixel and readout circuitry in a second active area of the unit active pixel, the readout circuitry of the second active area being shared by the at least two photoelectric conversion regions of the first active area, and the first active area and the second active area being separated by at least one non-active area in each unit active pixel,
    wherein a first pitch between adjacent photoelectric conversion regions in the first active area of each unit active pixel is substantially the same as a second pitch between adjacent photoelectric conversion regions of adjacent unit active pixels in column and row directions of the active pixel array, and
    wherein the first active areas of the unit active pixels are arranged in rows and columns so as to define row and column spacings extending there between, and wherein the second active areas of the array of unit active pixels are located at respective intersections of the row and column spacings defined between the first active areas.

* * * * *